US006823032B1

(12) United States Patent
Bening et al.

(10) Patent No.: US 6,823,032 B1
(45) Date of Patent: Nov. 23, 2004

(54) TELECOMMUNICATION DEVICE INCLUDING A CLOCK GENERATION UNIT

(75) Inventors: Andreas Bening, Roetenbach/Peg. (DE); Peter Kempf, Maarheeze (NL); Eckhard Walters, Roetenbach (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 710 days.

(21) Appl. No.: 09/711,230

(22) Filed: Nov. 13, 2000

(30) Foreign Application Priority Data

Nov. 13, 1999 (DE) .......................................... 199 54 696

(51) Int. Cl.[7] .............................. H03D 3/24; H03L 7/00; H03L 7/06
(52) U.S. Cl. ...................... 375/376; 327/145; 327/147
(58) Field of Search ................................. 375/376, 371, 375/373; 327/141, 144, 145, 146, 147

(56) References Cited

U.S. PATENT DOCUMENTS 5,349,544 A   9/1994   Wright et al. ............... 364/600
5,673,004 A * 9/1997   Park ........................... 331/1 A
6,194,939 B1 * 2/2001  Omas ......................... 327/298
6,282,184 B1 * 8/2001  Lehman et al. ............. 370/342

FOREIGN PATENT DOCUMENTS

WO   WO9721278   6/1997   ............ H04B/1/14

* cited by examiner

Primary Examiner—Khai Tran
Assistant Examiner—David B. Lugo
(74) Attorney, Agent, or Firm—Aaron Waxler

(57) ABSTRACT

To be able to use a clock generation unit (2) for different mobile radio systems, the clock generation unit (2) which includes a phase-locked loop (4) for converting a reference clock (fR) into a working clock is provided and includes circuit portions (16a, 16b; 20a, 20b) which are designed for different reference clocks (fR) while a respective one of the circuit portions (16a, 20a) to which a special reference clock (fR) is assigned can be selected. The clock generation unit (2) can thus be operated with different reference clocks of different mobile radio systems.

21 Claims, 3 Drawing Sheets

TELECOMMUNICATION DEVICE INCLUDING A CLOCK GENERATION UNIT

Figure 1:
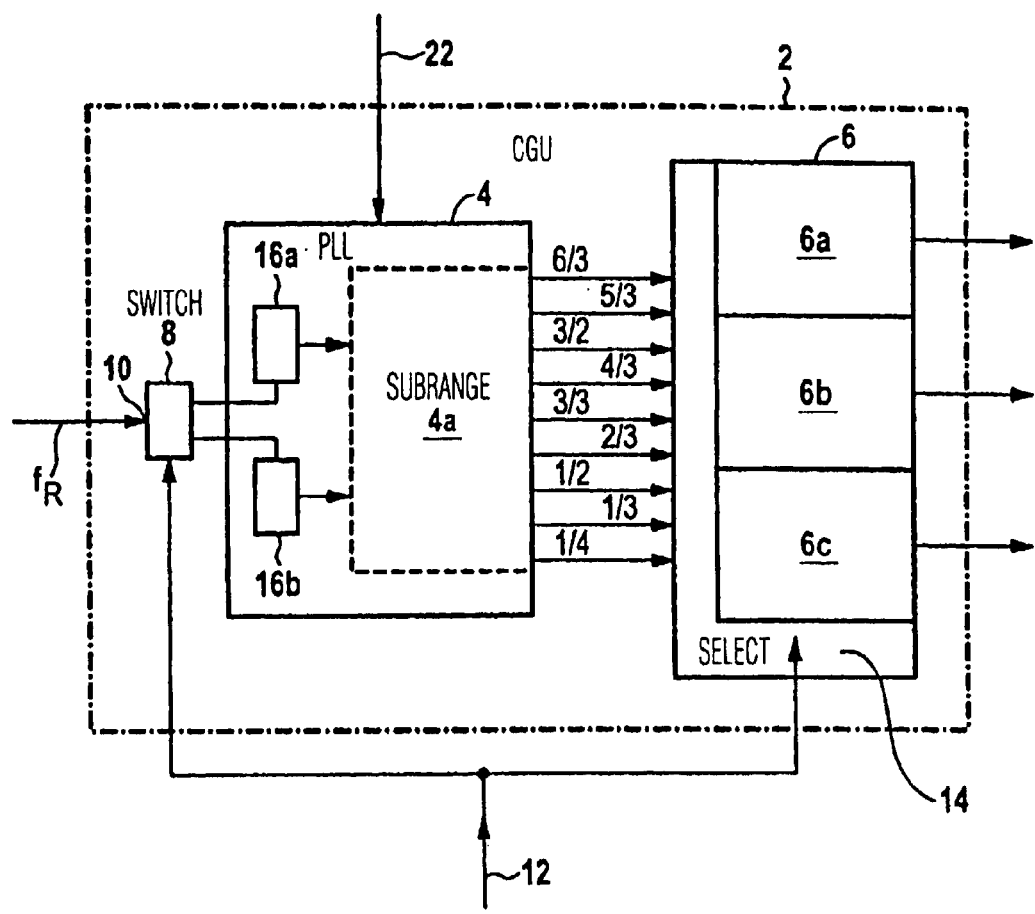

The invention relates to a telecommunication device including a clock generation unit, more particularly for a mobile radio system, having an input for a reference clock, including an electrical circuit arrangement which has a phase-locked loop for converting the reference clock into a working clock. The invention also relates to a clock generation unit as such. Clock generation units are usually inserted in communication devices for mobile radio systems, for example in mobiles, to provide a number of working clocks based on a reference clock which the clock generation unit is supplied with. The different functional units of the mobile are driven via the working clocks. Then, in dependence on the state of operation, the different functional units are supplied with different working clocks. In order to save energy, the function units are supplied with low-frequency working clocks, for example, in the stand-by mode and, on the other hand, with a high-frequency working clock in the radio mode.

The essential component of the clock generation unit (CGU) is the so-called phase-locked loop (PLL), which provides a plurality of working clocks based on the reference clock. The individual frequencies of the working clocks then have a fixed divider ratio to the frequency of the reference clock. The operation of a programmable phase-locked loop is described, for example, in U.S. Pat. No. 5,349,544. The use of a phase-locked loop for generating working clocks in a mobile radio system is known, for example, from WO 97/21278.

For generating as uniform clock signals as possible with steepest possible rising and falling edges, the clock generation unit and the phase-locked loop are tuned to the reference clock. The reference clock is supplied by an external clock generator having a fixed reference clock frequency. The phase-locked loops known from U.S. Pat. No. 5,349,544 and WO 97/21278 are supplied with a fixed reference clock.

In mobile radio systems there are different standards which are based on different reference clocks. Essential standard mobile radio systems are, for example, the GSM system (Global System for Mobile communications), the TDMA system (Time-Division Multiple Access) and the CDMA system (Code-Division Multiple Access). These systems have in common that they are arranged as multiplex systems, more particularly as time-multiplex systems, in which a plurality of time windows are provided within a time frame determined for the respective system, while different data can be transmitted in these time windows. The time frame comprises a plurality of basic units and the basic unit clock is derived from the reference clock of the mobile radio system. The basic unit clocks of the various systems are different from each other. For the GSM system is used a reference clock of 13 Mhz, for the TDMA system a reference clock of 19.44 MHz and for the CDMA system a reference clock of 19.66 MHz.

Due to the different reference clocks, the clock generation unit is to be specifically arranged for each mobile radio system. Since the clock generation unit is generally integrated on a microchip or IC, a change-over from one system to the other is only possible via an expensive change of the layout of the chip and is thus very costly.

The present invention has for its object to provide a telecommunication device including a clock generation unit and a method of generating a working clock, which device and method can be incorporated in the various mobile radio systems.

For achieving the object as regards the clock generation unit, this clock generation unit according to the invention has an input for a reference clock, and includes an electrical circuit arrangement with a phase-locked loop for changing the reference clock into a working clock, which circuit arrangement has circuit portions provided for different reference clocks and one of the circuit portions which is assigned to a special reference clockcan be selected.

The invention thus provides to arrange the telecommunication device or clock generation unit respectively, for use in various mobile radio systems. This is achieved in that mutually alternative circuit portions are installed in the clock generation unit, which portions are arranged for the respective mobile radio system. Depending on which mobile radio system the clock generation unit is to be used for, the circuit portion assigned to this respective mobile radio system is selected. Thus a certain or various defined working clocks are selected via the respective circuit portion.

The invention is based on the consideration that it is considerably more favorable for reasons of cost to install different circuit portions inside the clock generation unit of which only one circuit portion is necessary for use in a communication device (mobile), than keeping a clock generation unit of its own for each mobile radio system. The clock generation unit including the different circuit portions is especially advantageous in that with variations of capacity or variations of demand in the individual mobile radio systems, microchips with the integrated clock generation unit can be inserted into the other mobile radio systems without much expenditure.

In a preferred embodiment the circuit portions include each a divider module integrated particularly in the phase-locked loop, with the aid of which divider module the reference clock assigned to the respective circuit portion is changed into a plurality of working clocks, while the divider module is arranged so that at least several of its working clocks that can be generated by it are substantially the same.

In this respect it is assumed that the individual components in a mobile are tuned to certain working clocks and that it is therefore very efficient to provide those working clocks for which the components are arranged, irrespective of the mobile radio system in which the mobile is to be used. This has the decisive advantage that only the clock generation unit is to be adapted to the mobile radio system and the remaining components can, in essence, further be used unchanged.

When the reference clock is selected, the divider module assigned to the reference clock is selected at the same time as part of the circuit portion specially arranged for the reference clock. The divider modules are different, in essence, as regards the adjusted divider ratios. By arranging a plurality of divider modules, it is possible that at least several of the outputs of the clock generation unit are constantly supplied with the same working clocks, irrespective of the selected reference clock.

In an alternative embodiment there is preferably provided that the phase-locked loop has fixed divider ratios irrespective of the reference clock and that the suitable working clocks are selected via a selecting element. Such a selection normally occurs by sets of register bits and connected gate logic. The circuit portions can preferably be configured, more particularly, programmed, so that the desired working clocks are generated. For this. purpose, the circuit portion is supplied with, for example, respective configuration information. Particularly a fractional divider is provided here, via which substantially any working clock can be generated from any reference clock with a fractional division ratio. Such a fractional divider is particularly used for fine-tuning the working clocks.

Advantageously, the phase-locked loop includes on the input side different sets of circuit components tuned to the reference clocks, which components can be activated alternatively while they determine particularly the locking behavior of the phase-locked loop. This is advantageous in that the phase-locked loop locks on very fast and without any disturbance when switched on, so that it already works reliably after a very brief period of time.

As an alternative, the phase-locked loop includes a special set of switching components, which is suitable for processing a plurality of reference clocks. At the frequencies 19.44 and 19.66 MHz this is preferably achieved in that the set of switching components is tuned to a medium frequency. This does away with the necessity of having to provide a plurality of sets.

Preferably, the circuit portions for providing at least a substantially uniform working clock and, more particularly, for providing five substantially same working clocks are arranged so that the components connected downstream of the clock generation unit can be driven in various operating modes i.e. with various working clocks.

The selection which working clock is used is preferably made via a selection register, which is driven for example by a processor. In the selection register are stored the working clocks suitable for the five different components for various operating modes of the mobile. This is particularly effected to reduce the energy consumption.

In a particularly preferred embodiment a basic unit clock can be selected from the working clocks available, more particularly, by a software functionality. This is advantageous in that the basic unit clock can be fixed. This opens the possibility of selecting a suitable clock as the basic unit clock.

Preferably, the selection of the special circuit portion is made before the phase-locked loop is taken into operation, so that the circuit portions tuned to the reference clock are activated already on switch-on, as a result of which the phase-locked loop rapidly and reliably starts working.

In a useful embodiment the circuit portion assigned to the special reference clock is selected already by the layout of a microchip in which the clock generation unit is integrated (IC element). This arrangement is based on the consideration that when the microchip is manufactured, first the different circuit portions are provided and that the selection is made in a late step of the process. For the selection it is generally sufficient for the semiconductor modules included in the microchip to be switched individually. This creates the possibility of designing different mobile radio systems in a late step of the process during manufacture, for example, by selection of certain masks. Compared with a completely new design this is, on the one hand, considerably more flexible during manufacture and, on the other hand, considerably more cost-effective, even when more circuit portions are provided of which only one is physically activated as a result of the special configuration in a late manufacturing step.

The selection of the circuit portion is made with the aid of a selection signal which is preferably transmitted via a hardware component, more particularly, via a connecting pin. This advantageously enables the clock generation unit, for example, prior to it being installed in a mobile, to tune to the mobile radio system for which the mobile is to be used. Since a single operation is sufficient for this, the connecting pin is available for operation of the mobile and after that for other functionality's.

In an alternative arrangement, the selection is preferably made via a software functionality. For this purpose is provided, a register with a rewritable register entry which lays down the selected reference clock. This makes a highly simple and reversible selection possible.

Since the clock generation unit is first to be activated before it can extract the selection stored therein when the selection is made via a software functionality, it is extremely useful when the circuit arrangement of the clock generation unit is started with a separate slow reference start clock. Since the circuit portions are arranged for different reference clocks, there is a possibility that the circuit portions designed for the slow reference clocks are damaged when they are supplied with a high reference clock. Since the circuit arrangement is started with a clearly lower reference start clock, such damaging is impossible. The reference start clock is provided, for example, by a special clock generator which simultaneously drives an internal clock. It preferably provides a clock frequency in the kHz range, more particularly, a clock frequency of 32 kHz.

To avoid circuit portions being damaged, the circuit portion arranged for a high reference clock is preferably regularly selected when the phase-locked loop is taken into operation. If in the end a reference clock having a lower clock frequency is selected via the software functionality, the circuit portion arranged for the lower reference clock is changed over to when the phase-locked loop is switched on.

Advantageously, such a clock generation unit forms part of an integrated circuit which, for example, within the framework of a chip set, can be provided for assembling mobile radio systems.

For achieving the object as regards the method, according to the invention a phase-locked loop integrated with a circuit arrangement is supplied with the reference clock on the input side, and the phase-locked loop provides a working clock on the output side, while the circuit arrangement is arranged for different reference clocks and the circuit arrangement is at least tuned once to one of the reference clocks.

The essential idea here is that there is a tuning to a specific reference clock i.e. special circuit portions installed in the circuit arrangement are selected which are tuned to different reference clocks.

Further advantageous embodiments of the method may be learnt from the dependent claims. More particularly, the preferred embodiments arranged in view of the clock generation unit and special advantages can basically be transferred to the method.

These and other aspects of the invention are apparent from and will be elucidated with reference to the embodiment(s) described hereinafter.

IN THE DRAWINGS

Figure 2:
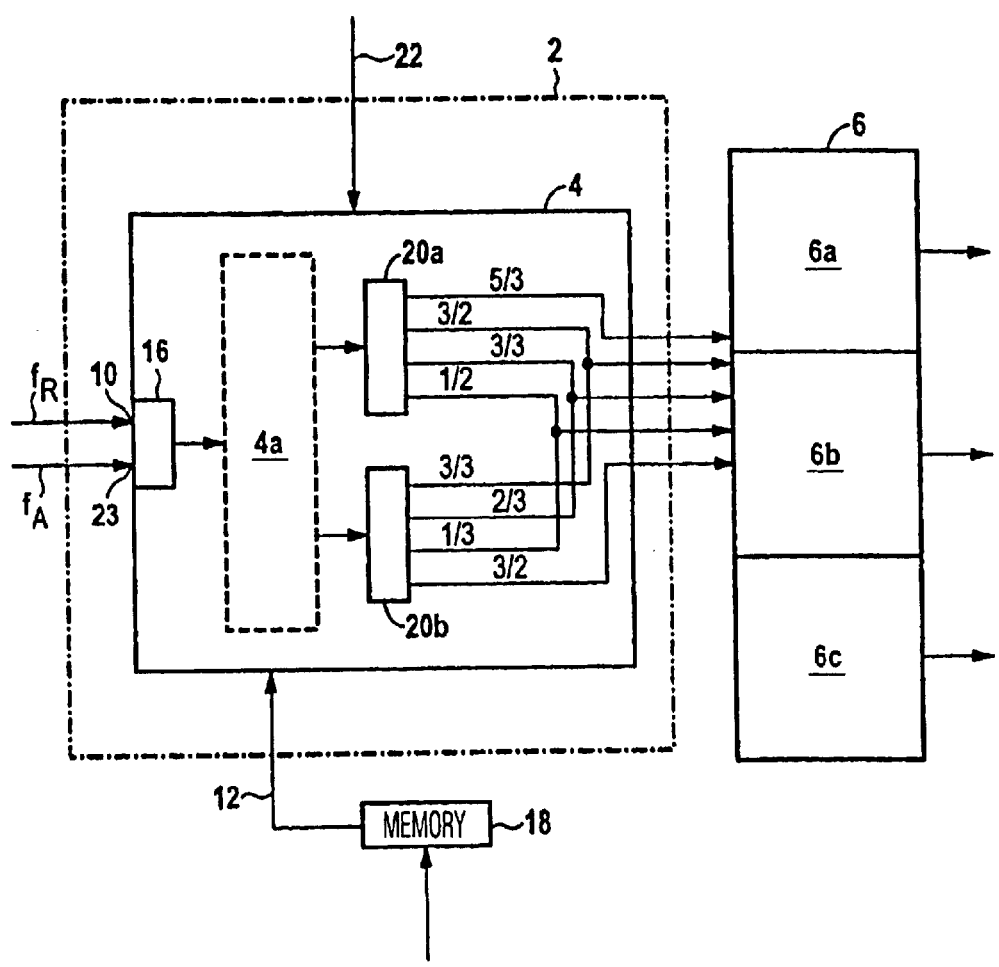
Figure 3:
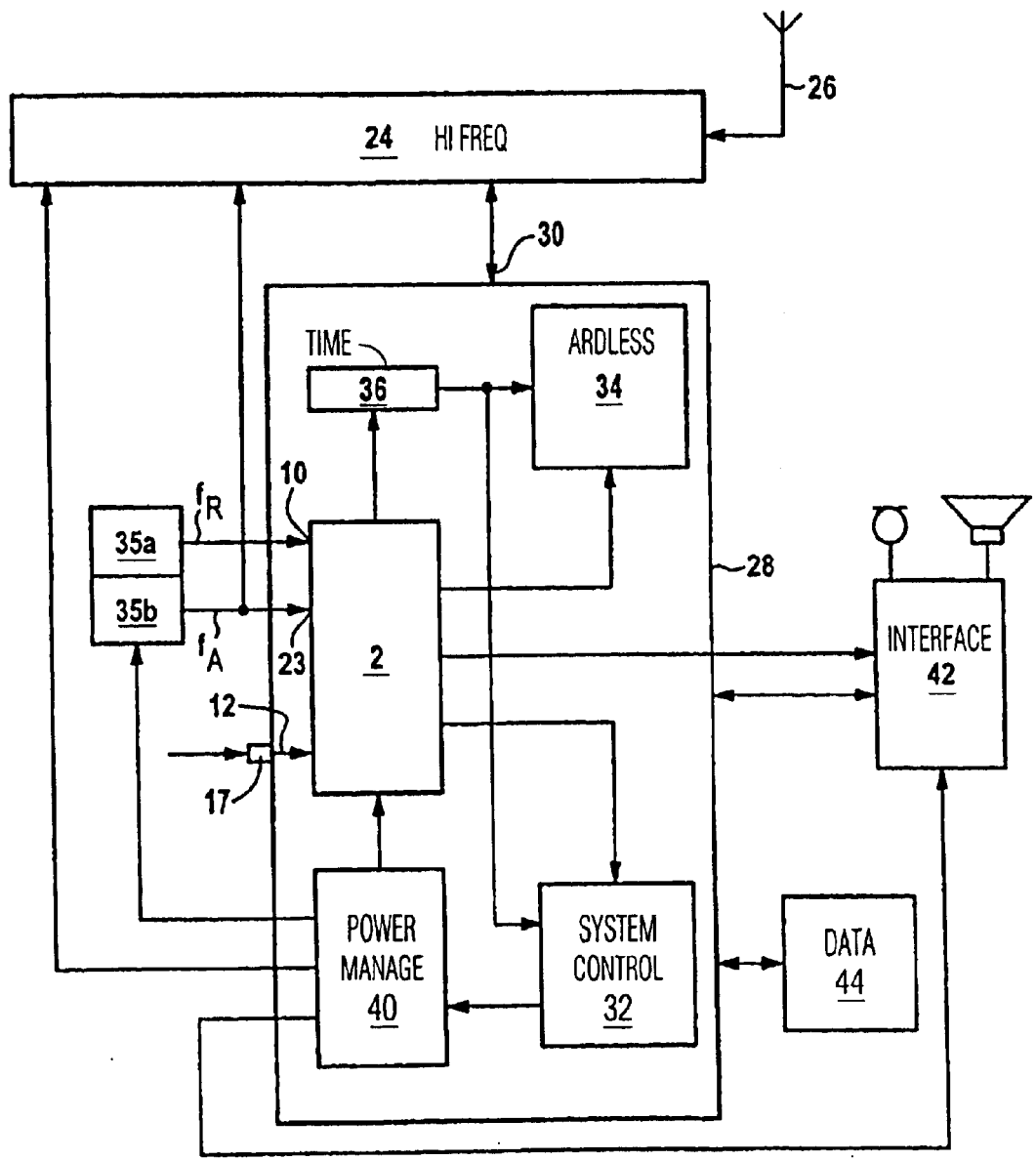

FIG. 1 shows a block diagram of a clock generation unit with a phase-locked loop, FIG. 2 shows a block diagram of an alternative clock generation unit, and FIG. 3 shows a block diagram of a mobile radio system device.

According to FIG. 1 a clock generation unit 2 comprises a phase-locked loop 4, a selection register 6, a switching element 8 and an input 10 for a reference clock fR. The phase-locked loop 4, the selection register 6 and the switching element 8 form part of a circuit arrangement of the clock generation unit 2. This unit 2 can be supplied with a selection signal 12 which is sent to the switching element 8 and to a selecting element 14 which more particularly forms part of the selection register 6.

Via the selection signal 12 is determined for which reference clock fR the clock generation unit 2 is arranged. According to FIG. 1 this is effected, on the one hand, in that the switching element 8 alternately connects the input 10 to a first or with a second set of circuit portions 16a, 16b in dependence on the selection signal 12. The sets 16a, 16b are integrated on the input side with the phase-locked loop 4 and determine its locking pattern. They are tuned to different reference clocks, to provide a fastest possible lock-on when the respective reference clock fR is selected. The set 16a is tuned to, for example, the reference frequency 13 MHz for the GSM system and the set 16b is tuned as a special set to about 19.5 MHz for the TDMA and the CDMA system together. The special set 16b is arranged so that a sufficiently good lock-on pattern of the phase-locked loop 4 is ensured, independent of the applied reference frequency fR. With the latter two it is also possible to have separate sets. The circuit element 8 applies the reference clock fR to only one set 16a or 16b respectively, which clock is further processed in a sub-range 4a in the phase-locked loop 4. The sets 16a, 16b specifically belong to circuit portions working with the reference clock fR. The sub-range 4a preferably includes a fractional divider via which a fine tuning is made for the generation of the working clocks. The fractional divider is then configured in dependence on the reference frequency fR, so that exactly the desired working clocks are provided whatever reference frequency fR is selected.

The phase-locked loop 4 provides on the output side a plurality of working clocks whose frequencies have a fixed divider ratio to the frequency of the reference clock fR. They are in particular the divider ratios 6/3, 5/3, 3/2, 4/3, 3/3, 2/3, 1/2, 1/3 and 1/4. The selection register 6 collects suitable working clocks from these working clocks. For this purpose, the selection register 6 is preferably subdivided into a plurality of sub-registers 6a, 6b, 6c which perform, for example, the selection of a suitable working clock for a man-machine interface 42, for various processors 32, 34 and for a time base unit 36 (compare FIG. 3).

According to the example of embodiment of FIG. 1, the phase-locked loop 4 supplies through its output fixed divider ratios for the reference clock fR applied to the input. With different reference clocks fR there are thus different working clocks available on the individual outputs of the phase-locked loop as a result of the fixed divider ratios. When there is a reference clock fR of 13 MHz, with a divider ratio 6/3 there will be a working clock of 26 MHz on the output, whereas there will be a working clock of 38.88 MHz on the same output when there is a reference clock of 19.44 MHz. To supply suitable working clocks to the components connected downstream of the clock generation unit 2, the selecting element 14 is provided. This element is arranged, for example, as a memory in which the information is stored what working clock is available on what output at what reference clock fR. Stored therein is, for example, that with a reference clock fR of 13 MHz, the 26 MHz working clock can be retrieved through the output with the 6/3 divider ratio. On the other hand, with a reference clock fR of 19.44 MHz the substantially same working clock of 25.92 MHz is available on the 4/3 output. The selecting element 14 transmits this information to the sub-registers 6a to 6c, so that they cause the right output to be accessed when, for example, a 26 MHz working clock is to be retrieved.

The different divider ratios of the phase-locked loop 4 are tuned to the reference clocks fR of the different mobile radio systems, so that a plurality of the available working clocks have a substantially same value irrespective of the applied reference clock fR. As can be learnt from the Table below by way of example, a total of five substantially the same clock frequencies can be set for the different mobile radio systems. They are the working clock frequencies 26 MHz, 19.5 MHz, 13 MHz, 6.5 MHz and 4.3 MHz (emphasis in bold print).

| Divider ratio | GSM fR = 13 MHz | TDMA fR = 19.44 MHz | CDMA fR = 19.66 MHz |
|---|---|---|---|
| 6/3 | 26 MHz | 38.88 MHz | 39.36 MHz |
| 5/3 | 21.67 MHz | 32.4 MHz | 32.8 MHz |
| 3/2 | 19.5 MHz | 29.16 MHz | 29.52 MHz |
| 4/3 | 17.33 MHz | 25.92 MHz | 26.24 MHz |
| 3/3 | 13 MHz | 19.44 MHz | 19.68 MHz |
| 2/3 | 8.66 MHz | 12.96 MHz | 13.12 MHz |
| 1/2 | 6.5 MHz | 9.72 MHz | 9.64 MHz |
| 1/3 | 4.33 MHz | 6.48 MHz | 6.56 MHz |
| 1/4 | 3.25 MHz | 4.86 MHz | 4.9 MHz |

For transferring the selection signal 12 to the circuit arrangement of the clock generation unit 2 there are various possibilities. One possibility is that the selection signal 12 is transferred via a hardware terminal, for example, via a connecting pin 17 (shown in FIG. 3).

The connection pin 17 is then supplied with a selection signal 12 which, for example, leads to the switching element 8 irreversibly connecting the input 10 to a set of circuit portions 16a, 16b. At the same time, the information about the reference clock fR is preferably also irreversibly written in the selecting element 14 arranged as a memory. The clock generation unit 2 is therefore tuned to a certain reference clock fR by a single selection. This tuning is not of necessity irreversible. Another possibility not shown in the FIGS. 1s, for example, to provide more connecting pins which are provided for connecting different reference clocks fR. Depending on which of the connecting pins is connected, either of the two sets of circuit portions 16a, 16b is supplied with the reference clock fR.

The selection is preferably made before the phase-locked loop 4 is taken into operation, so that already when switched on, the right circuit portions are selected. Since in several operating modes of the mobile, for example in the standby mode, the clock generation unit 2 is turned off via a reset signal 22, the selection of the selection signal is preferably made before the reset is deactivated.

As an alternative for the hardware embodiment, a software functionality is provided via which the selection signal 12 is transferred. For this purpose, a memory 18 according to FIG. 2 is provided, in which the information about the selected reference clock is stored. This information can be overwritten.

FIG. 2 shows an alternative embodiment of the clock generation unit 2. Different from the clock generation unit 2 shown in FIG. 1, the selection register 6 is not integrated with the clock generation unit 2. The set of individual circuit portions 16a, 16b shown in FIG. 1 is symbolized by the set of switch components 16.

The memory 18 according to FIG. 2 is arranged outside the clock generation unit 2, but may also form a part thereof. Since the selection information is stored in the memory 18, the information is not retrieved by the clock generation unit 2 until the mobile is taken into operation. To avoid that components are supplied with too high a clock frequency and are damaged, there is provided to supply the clock generation unit 2, when switched on, with a reference start clock fA which has a lower frequency compared to the reference clock fR. For this purpose a second input 23 is provided. Preferably a clock frequency in the kHz range is selected for this purpose, which is provided for an internal clock in the mobile. Immediately after the mobile is turned on, the selection information is retrieved from the memory 18 and the selection signal 12 provides the selection of the special circuit portions which correspond to the selected reference clock fR. In the example of embodiment shown in FIG. 2 these special circuit portions are the divider modules 20a, 20b.

Alternatively, a basic adjustment is provided at which the respective circuit portions designed for a high reference clock fR are activated when the clock generation unit 2 is taken into operation. If a lower reference clock fR is selected, the circuit portions associated to this clock will not be activated until after the switching on. The selection signal 12 is transferred to the sub-range 4a of the phase-locked loop 4, which is installed between the set of switching components 16 and the divider modules 20a, 20b.

Depending on the transferred selection information 12, either of the two divider modules 20a, 20b is selected. With respect to their divider ratios they are arranged so t they provide at least several substantially equal working clocks. The outputs of the divider modules 20a, 20b, which modules provide the some working clocks, are connected to each other and may be retrieved from the outputs of the clock generation unit 2. Therefore, at least on several outputs of the clock generation unit 2, the same working clocks are available, irrespective of the input reference frequency. In the example of embodiment shown in FIG. 2 it is assumed that the divider module 20a is arranged for the 13 MHz working clock and has, for example, the divider ratios 5/3, 3/2, 3/3 and 1/2. In contrast, the divider module 20b has the divider ratios 3/3, 2/3, 1/3 and 3/2 and is arranged for a reference clock of about 19.5 MHz, so that three substantially the same clock frequencies are provided by the two divider modules 20a, 20b. The working clocks provided by the clock generation unit 2 are transported to the selection register 6 which bas only three sub-registers 6a, 6b, 6c in contrast to the FIG. 1. Since the same working clocks are available on at least several outputs of the clock generation unit 2 irrespective of the selection made, a selecting element 14 is not absolutely necessary in the example of embodiment shown in FIG. 2.

In the following is briefly explained with reference to FIG. 3 the co-operation of essential components in a communication device, for example, a mobile of a mobile radio system. This mobile comprises a high-frequency unit 24 which forms the interface to the atmosphere via an antenna 26. The high-frequency unit 24 is supplied with a reference clock fR and connected to a microchip 28 as represented by the double arrow 30. The connection is effected via a digital-to-analog converter, which converts the analog signals of the high-frequency unit 24 into digital signals for the microchip 28 and vice versa. Integrated on the microchip 28 is a so-called baseband circuit arranged as a switching device. It has the clock generation unit 2 as a central element, which unit supplies a suitable working clock to a system control processor 32 and a baseband processor 34. The baseband processor 34 is responsible, for example, for the speech processing, whereas the system control processor 32 controls the internal procedures in the mobile.

The clock generation unit 2 sends a special working clock, the so-called basic unit clock, to a time base unit 36. For the GSM system the time base unit 36 is preferably supplied with a working clock having a frequency of 4.33 MHz. The time base unit 36 provides the exactly defined time frame of the respective mobile radio system. This time frame is subdivided into a plurality of basic units, which are transmitted by the time base unit 36 to the two processors 32, 34 in the form of basic unit clocks.

The clock generation unit 2 is connected with its input 10 to a clock generator 35a for the reference clock fR and with a further input 23 to a clock generator 35b for the reference start clock fA. The selection of the special reference clock fR is made via the connecting pin 17 on the microchip 28 through which the selection signal 12 is transferred to the clock generation unit 2.

Via the connecting pin 17 are preferably also made program steps of the programmable clock generation unit 2. For example, the basic unit clock provided for the time base unit 36 is adjusted by means of a respective program indication. The clock generation unit 2 arranged for the different reference clocks fR has in essence the advantage that it can be integrated in a simple manner with existing baseband circuits for different mobile radio systems. It is not necessary to adapt the other components of the baseband switching circuit to the clock generation unit 2, because this unit provides suitable working clocks irrespective of the reference clock fR.

For controlling the internal functional procedures, the system control processor 32 is particularly connected to a power management unit 40. Based on the actual operating requirements the system control processor 32 establishes which working clock is selected for which component. This information is transported via the power management unit 40 to the clock generation unit 2, which then delivers the respective working clocks to the further components. This is effected, for example, via the selection register 6 shown in the FIGS. 1 and 2. At the same time the high-frequency unit 24, the clock generator 35a for the reference clock fR as well as a man-machine interface 42 are switched to a suitable operating mode, for example, a standby mode via the power management unit 40. For controlling the internal functional procedures the baseband circuit integrated on the microchip 28 preferably falls back on the information stored in a data memory 44.

What is claimed is:

1. A telecommunication device including a clock generation unit (2) having an input (10) for a reference clock (fR), including an electrical circuit arrangement which has a phase-locked loop (4) for converting the reference clock (fR) into a working clock, wherein the circuit arrangement has circuit portions (16a, 16b; 20a, 20b) provided for different reference clocks (fR) and one of the circuit portions (16a, 16b; 20a, 20b) can be selected, and wherein the circuit portions (20a, 20b) include each a divider module (20a, 20b) integrated especially with the phase-locked loop (4) for converting the reference clock (fR) assigned to the circuit portion (20a; 20b) into a plurality of working clocks, and the divider modules (20a, 20b) are arranged so that several of the working clocks that can be generated by them are substantially the same.

2. A telecommunication device including a clock generation unit (2) as claimed in claim 1, characterized in that the circuit portions (16a, 16b; 20a, 20b) can be configured in dependence on the reference clock (fR).

3. A telecommunication device including a clock generation unit (2) as claimed in claim 1, characterized in that the phase-locked loop (4) has on the input side sets of different circuit portions (16a, 16b) tuned to the reference clocks (fR), which sets of different circuit portions determine the locking pattern of the phase-locked loop (4) and can be activated selectively.

4. A telecommunication device including a clock generation unit (2) as claimed in claim 1, characterized in that the phase-locked loop (4) has on the input side a special set of circuit portions (16) which set of circuit portions determines the locking pattern of the phase-locked loop (4) and is suitable for processing a plurality of reference clocks (fR).

5. A telecommunication device including a clock generation unit (2) as claimed in claim 1, characterized in that the circuit portions (16a, 16b; 20a, 20b) are arranged for providing at least a substantially same working clock.

6. A telecommunication device including a clock generation unit (2) as claimed in claim 5, characterized in that the provided working clocks can be selected via a selection register (6).

7. A telecommunication device including a clock generation unit (2) as claimed in claim 1, characterized in that from the working clocks can be selected a basic unit clock more particularly via a programmable software functionality.

8. A telecommunication device including a clock generation unit (2) as claimed in claim 1, characterized in that the circuit arrangement is designed so that the selection of the circuit portions (16a, 20a) assigned to the special reference clock (fR) is made before the phase-locked loop (4) is taken into operation.

9. A telecommunication device including a clock generation unit (2) as claimed in claim 1, characterized in that the clock generation unit (2) is integrated with (28) and in that one of the circuit portions (16a, 16b; 20a, 20b) is selected by the layout of the microchip (28).

10. A telecommunication device including a clock generation unit (2) as claimed in claim 1, characterized in that for selecting the circuit portion (16a, 20a) assigned to the special reference clock (fR) a connecting pin (17) is provided for transmitting a selection signal.

11. A telecommunication device including a clock generation unit (2) as claimed in claim 1, characterized in that for selecting the circuit portion assigned to the special reference clock (fR) a software functionality integrated with the circuit arrangement is provided.

12. A telecommunication device including a clock generation unit (2) as claimed in claim 11, characterized in that a register (6) is provided which has a rewritable register entry via which the selection of the reference clock (fR) is fixed.

13. A telecommunication device including a clock generation unit (2) as claimed in claim 11, characterized in that the circuit arrangement has a further input (38) for a slow reference start clock (fA) to which the phase-locked loop (4) is connected when it is taken into operation.

14. A telecommunication device including a clock generation unit (2) as claimed in claim 11, characterized in that the circuit portion (16b, 20b) arranged for a high reference clock (fR) is selected when the phase-locked loop (4) is taken into operation.

15. A telecommunication device including a clock generation unit (2), more particularly for a mobile radio system, having an input (10) for a reference clock (fR), including an electrical circuit arrangement which has a phase-locked loop (4) for converting the reference clock (fR) into a working clock, wherein the circuit arrangement has circuit portions (16a, 16b; 20a, 20b) provided for different reference clocks (fR) and in that one of the circuit portions (16a, 16b; 20a, 20b) can be selected wherein the phase-locked loop (4) has fixed divider ratios irrespective of the selected circuit portion (16a 16b; 20a, 20b) for converting the reference clock (fR) into a plurality of working clocks, and in that a selecting element (14) is provided which selects certain working clocks generated by the phase-locked loop (4) in dependence on the reference clock (fR) associated with the selected circuit portion.

16. A clock generation unit (2), more particularly for a mobile radio system, having an input (10) for a reference clock (fR), including an electrical circuit arrangement which has a phase-locked loop (4) for converting the reference clock (fR) into a working clock, characterized in that the circuit arrangement includes circuit portions (16a, 16b; 20a, 20b) arranged for different reference clocks (fR) and in that one of the circuit portions (16a, 20a) can be selected, and wherein the circuit portions (20a, 20b) include each a divider module (20a, 20b) integrated especially with the phase-locked loop (4) for converting the reference clock (fR) assigned to the circuit portion (20a; 20b) into a plurality of working clocks, and the divider modules (20a, 20b) are arranged so that several of the working clocks that can be generated by them are substantially the same.

17. A method of generating a working clock comprising: supplying a phase-locked loop (4), integrated with a circuit arrangement, with the reference clock (fR) on the input side; and providing the working clock on the output side, wherein the circuit arrangement is designed for different reference clocks (fR) and the circuit arrangement is tuned at least once to one of the reference clocks (fR), and wherein the circuit portions (20a, 20b) include each a divider module (20a, 20b) integrated especially with the phase-locked loop (4) for converting the reference clock (fR) assigned to the circuit portion (20a; 20b) into a plurality of working clocks, and the divider modules (20a, 20b) are arranged so that several of the working clocks that can be generated by them are substantially the same.

18. A method as claimed in claim 17, characterized in that the tuning is effected before the phase-locked loop (4) is put into operation.

19. A method as claimed in claim 16, characterized in that the circuit arrangement is supplied with a selection signal via a connecting pin (17), on account of which selection signal a tuning is effected.

20. A method as claimed in claim 16, characterized in that selection information about the reference clock (fR) is stored at least once in a selection register (6) on the basis of which information the tuning is effected.

21. A method as claimed in claim 16, characterized in that the phase-locked loop (4) is supplied with a slow reference start clock (fA) at least when taken into operation, in that thereafter the tuning to the reference clock (fR) is effected and the phase-locked loop (4) is supplied with the reference clock (fR).

* * * * *

UNITED STATES PATENT AND TRADEMARK OFFICE
CERTIFICATE OF CORRECTION

PATENT NO.        : 6,823,032 B1                                                    Page 1 of 1
APPLICATION NO.   : 09/711230
DATED             : November 23, 2004
INVENTOR(S)       : Andreas Bening et al.

It is certified that error appears in the above-identified patent and that said Letters Patent is hereby corrected as shown below:

Column 9, lines 15-16, delete "a basic unit clock more particularly"

Column 10, line 43, "16" should be --17--

Column 10, line 47, "16" should be --17--

Signed and Sealed this

Seventh Day of September, 2010

David J. Kappos
*Director of the United States Patent and Trademark Office*